United States Patent
Koizumi et al.

(10) Patent No.: US 12,550,252 B2
(45) Date of Patent: Feb. 10, 2026

(54) WIRING BOARD

(71) Applicant: Murata Manufacturing Co., Ltd., Nagaokakyo (JP)

(72) Inventors: Kaori Koizumi, Nagaokakyo (JP); Yuki Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 176 days.

(21) Appl. No.: 18/416,977

(22) Filed: Jan. 19, 2024

(65) Prior Publication Data
US 2024/0206051 A1 Jun. 20, 2024

Related U.S. Application Data

(63) Continuation of application No. PCT/JP2022/040179, filed on Oct. 27, 2022.

(30) Foreign Application Priority Data

Nov. 18, 2021 (JP) .................................. 2021-188136

(51) Int. Cl.
*H05K 1/02* (2006.01)
*H05K 1/05* (2006.01)
*H05K 3/46* (2006.01)

(52) U.S. Cl.
CPC ........... *H05K 1/0271* (2013.01); *H05K 1/028* (2013.01); *H05K 1/056* (2013.01); *H05K 3/4655* (2013.01); *H05K 2201/0212* (2013.01)

(58) Field of Classification Search
CPC .............................. H05K 1/0271; H05K 1/115
See application file for complete search history.

(56) References Cited

U.S. PATENT DOCUMENTS 6,143,116 A * 11/2000 Hayashi ................... H05K 3/20
29/830
2006/0274510 A1* 12/2006 Nakada ................ H05K 3/4632
361/748

(Continued)

FOREIGN PATENT DOCUMENTS

JP 2004273575 A 9/2004
JP 2006100170 A 4/2006

(Continued)

OTHER PUBLICATIONS

International Search Report in PCT/JP2022/040179, mailed Jan. 24, 2023, 3 pages.

(Continued)

*Primary Examiner* — John B Freal
(74) *Attorney, Agent, or Firm* — Keating & Bennett, LLP

(57) ABSTRACT

A wiring board includes an insulating layer, a conductive layer on the insulating layer, and an interlayer connection conductor extending through the insulating layer in a lamination direction. The interlayer connection conductor is connected to the conductive layer. When a thermal expansion coefficient of the insulating layer in the lamination direction is defined as $\alpha_{z10}$, a thermal expansion coefficient of the interlayer connection conductor in the lamination direction is defined as $\alpha_{z30}$, a storage elastic modulus of the insulating layer is defined as $E'_{10}$, and a storage elastic modulus of the interlayer connection conductor is defined as $E'_{30}$, relationships of $\alpha_{z10} > \alpha_{z30}$ and $E'_{10} > E'_{30}$ are satisfied in a temperature range from about −40° C. to about 85° C.

18 Claims, 7 Drawing Sheets

(56) References Cited

U.S. PATENT DOCUMENTS

| | | | |
|---|---|---|---|
| 2008/0099121 A1 | 5/2008 | Oka et al. | |
| 2010/0307809 A1* | 12/2010 | Noda | H05K 3/4602 |
| | | | 29/829 |
| 2015/0245473 A1* | 8/2015 | Shimizu | H05K 1/113 |
| | | | 29/850 |
| 2020/0113050 A1 | 4/2020 | Sato et al. | |
| 2022/0199497 A1* | 6/2022 | Sung | H01L 23/5386 |

FOREIGN PATENT DOCUMENTS

| | | |
|---|---|---|
| JP | 2006165508 A | 6/2006 |
| JP | 2015103720 A | 6/2015 |
| WO | 2019003729 A1 | 1/2019 |

OTHER PUBLICATIONS

Written Opinion in PCT/JP2022/040179, mailed Jan. 24, 2023, 4 pages.

* cited by examiner

WIRING BOARD

CROSS REFERENCE TO RELATED APPLICATIONS

This application claims the benefit of priority to Japanese Patent Application No. 2021-188136 filed on Nov. 18, 2021 and is a Continuation Application of PCT Application No. PCT/JP2022/040179 filed on Oct. 27, 2022. The entire contents of each application are hereby incorporated herein by reference.

BACKGROUND OF THE INVENTION

1. Field of the Invention

The present invention relates to wiring boards.

2. Description of the Related Art

Japanese Unexamined Patent Application Publication No. 2006-100170 discloses a conductive paste to fill a via hole or the like formed in a manufacturing process of a multilayer wiring board and establish electric connection between circuits (between layers). The conductive paste described in Japanese Unexamined Patent Application Publication No. 2006-100170 contains conductive particles, and a resin mixture in which the content of epoxy resin having a molecular weight of 10,000 or above is in a range from 30% to 90% by weight in total resin components. The resin mixture has an elastic modulus being equal to or below 2 GPa at 85° C. after curing. Here, the content of the conductive particles is in a range from 30% to 75% by volume.

According to Japanese Unexamined Patent Application Publication No. 2006-100170, a process to fill the via hole is thought to be improved by using mixed resin containing a predetermined ratio of epoxy resin having the molecular weight of 10,000 or above as the resin in the conductive paste, and a change in electric resistance over time of a connecting portion, which is formed by using the conductive paste, under a high-temperature and high-humidity environment is thought to be reduced by setting the elastic modulus after curing the resin mixture containing the resin equal to or below a predetermined value.

However, the inventors of example embodiments of the present invention have discovered that the wiring board such as a multilayer wiring board has a larger impact on a fluctuation of a resistance value in an environment in which thermal shocks are repeatedly applied in association with usage at a low temperature of about −40° C. up to a high temperature of about 85° C. as compared to in the high-temperature and high-humidity environment. It has therefore been proven that the simple reduction of the elastic modulus at about 85° C. as described in Japanese Unexamined Patent Application Publication No. 2006-100170 is insufficient reduce or prevent the fluctuation of the resistance value.

SUMMARY OF THE INVENTION

Example embodiments of the present invention provide wiring boards which are each able to reduce or prevent a fluctuation of a resistance value even in an environment in which thermal shocks are repeatedly applied.

A wiring board according to an example embodiment of the present invention includes an insulating layer, a conductive layer on the insulating layer, and an interlayer connection conductor extending through the insulating layer in a lamination direction in which the insulating layer and the conductive layer are laminated, the interlayer connection conductor being connected to the conductive layer. When a thermal expansion coefficient of the insulating layer in the lamination direction is defined as $\alpha_{z10}$, a thermal expansion coefficient of the interlayer connection conductor in the lamination direction is defined as $\alpha_{z30}$, a storage elastic modulus of the insulating layer is defined as $E'_{10}$, and a storage elastic modulus of the interlayer connection conductor is defined as $E'_{30}$, relationships of $\alpha_{z10} > \alpha_{z30}$ and $E'_{10} > E'_{30}$ are satisfied in a temperature range from about −40° C. to about 85° C.

According to example embodiments of the present invention, it is possible to provide wiring boards which are each able to reduce or prevent a fluctuation of a resistance value even in an environment in which thermal shocks are repeatedly applied.

The above and other elements, features, steps, characteristics and advantages of the present invention will become more apparent from the following detailed description of the example embodiments with reference to the attached drawings.

BRIEF DESCRIPTION OF THE DRAWINGS

FIG. 2-1 is a stress distribution chart calculated from a thermal stress simulation when a temperature is lowered from room temperature to about −40° C. under conditions of $\alpha_{z10} > \alpha_{z30}$ and $E'_{10} > E'_{30}$.

FIG. 2-2 is a stress distribution chart calculated from thermal stress simulation when the temperature is raised from room temperature to about 85° C. under the conditions of $\alpha_{z10} > \alpha_{z30}$ and $E'_{10} > E'_{30}$.

FIG. 3-1 is a stress distribution chart calculated from thermal stress simulation when the temperature is lowered from room temperature to about −40° C. under conditions of $\alpha_{z10} > \alpha_{z30}$ and $E'_{10} < E'_{30}$.

FIG. 3-2 is a stress distribution chart calculated from thermal stress simulation when the temperature is raised from room temperature to about 85° C. under the conditions of $\alpha_{z10} > \alpha_{z30}$ and $E'_{10} < E'_{30}$.

DETAILED DESCRIPTION OF THE EXAMPLE EMBODIMENTS

Wiring boards according to example embodiments of the present invention will be described below with reference to the drawings.

However, the present invention is not limited to the following example embodiments, and it is possible to apply appropriate changes within a range not changing the gist of the present invention. The present invention also encompasses a combination of two or more configurations of example embodiments of the present invention to be described below.

Figure 1:
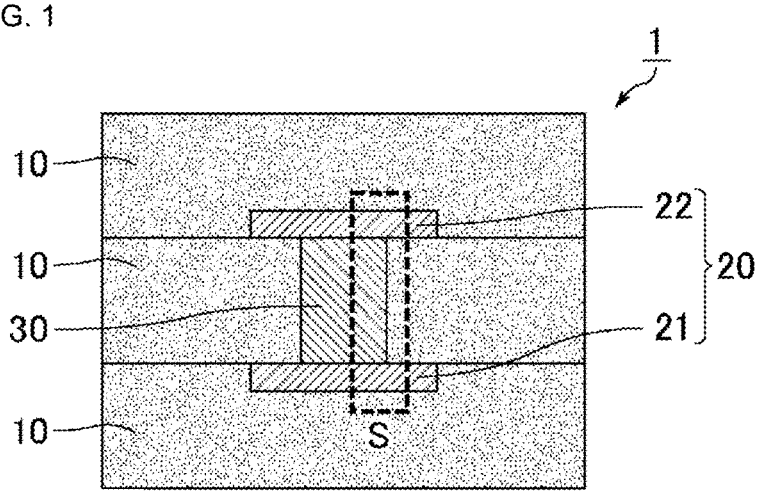
FIG. 1 is a sectional view schematically illustrating a wiring board according to an example embodiment of the present invention.

FIG. 1 is a sectional view schematically illustrating a wiring board according to an example embodiment of the present invention.

Although FIG. 1 does not illustrate the entire configuration, a wiring board 1 includes an insulating layer 10, a conductive layer 20 laminated on the insulating layer 10, and an interlayer connection conductor 30 extending through the insulating layer 10 in a lamination direction (an up-down direction in FIG. 1) in which the insulating layer 10 and the conductive layer 20 are laminated. The interlayer connection conductor 30 is connected to the conductive layer 20.

The wiring board 1 may include one insulating layer 10 or two or more insulating layers 10. In other words, the wiring board 1 may be a single-layer wiring board or a multilayer wiring board. In the case where the wiring board 1 includes the two or more insulating layers 10, configurations of the insulating layers 10 may be the same as or different from each other.

The insulating layer 10 includes, for example, a resin sheet with a plate shape or a sheet shape having an electrical insulating property. A resin of the resin sheet may be, for example, a thermoplastic resin or a thermosetting resin. However, a thermoplastic resin is preferable. In the case where the wiring board 1 includes the two or more insulating layers 10, the use of the resin sheets made from the thermoplastic resin enables lamination of multiple resin sheets each provided with the conductive layer 20, and pressure bonding collectively by a heat treatment.

Examples of the thermoplastic resin include a liquid crystal polymer (LCP), a thermoplastic polyimide resin, a polyether ether ketone resin (PEEK), a polyphenylenesulfide resin (PPS), and the like.

The insulating layer 10 is preferably made of, for example, the liquid crystal polymer (LCP). The liquid crystal polymer has a low water absorption rate as compared to other thermoplastic resins. Accordingly, in the case where the insulating layer 10 is made of the liquid crystal polymer, it is possible to reduce moisture remaining in the insulating layer 10.

A thickness of the insulating layer 10 is, for example, preferably about 10 μm or more and about 200 μm or less, or more preferably about 20 μm or more and about 100 μm or less. In the case where the wiring board 1 includes the two or more insulating layers 10, the thicknesses of the insulating layers 10 may be equal to or different from each other.

The conductive layer 20 only needs to be provided at least on one of principal surfaces of the insulating layer 10. In the example illustrated in FIG. 1, the conductive layer 20 includes a first conductive layer 21 provided on one principal surface of the insulating layer 10, and a second conductive layer 22 provided on another principal surface of the insulating layer 10.

The conductive layer 20 may have a patterned shape that is patterned into a wiring shape or the like, or a planar shape that spreads on a plane.

The conductive layer 20 is, for example, a metal layer including any of copper, silver, aluminum, stainless steel, nickel, gold, an alloy including at least one of these metal elements, and the like. The conductive layer 20 is, for example, preferably made of metal foil, or more preferably made of copper foil.

The conductive layer 20 may have a matte surface on one principal surface and a shiny surface on the other principal surface.

A thickness of the conductive layer 20 is, for example, preferably about 1 μm or more and about 35 μm or less, or more preferably about 6 μm or more and about 18 μm or less.

The interlayer connection conductor 30 is structured to be connected to the conductive layer 20 while extending through the insulating layer 10 in the lamination direction but not extending through the conductive layer 20. The interlayer connection conductor 30 may pass through the two or more insulating layers 10 in the lamination direction.

In the example illustrated in FIG. 1, the interlayer connection conductor 30 is connected to the first conductive layer 21 on the one principal surface side of the insulating layer 10 and is connected to the second conductive layer 22 on the other principal surface side of the insulating layer 10, while extending through the insulating layer 10 in the lamination direction. That is, the first conductive layer 21 is electrically connected to the second conductive layer 22 with the interlayer connection conductor 30 interposed therebetween.

For example, the interlayer connection conductor 30 is provided by filling a via hole, which is provided to extend to the conductive layer 20 while extending through the insulating layer 10 in the thickness direction but not extending through the conductive layer 20 in the thickness direction, with a conductive paste and subjecting the via hole with the conductive paste to a heat treatment.

In the case where the interlayer connection conductor 30 is formed by the heat treatment of the conductive paste, examples of conductive filler to be included in the interlayer connection conductor 30 include powder of copper, powder of a copper alloy, or the like, which has high conductivity. From the viewpoint of preventing surface oxidation, at least a portion of a surface of the powder of copper or the powder of the copper alloy may be coated with a metal, or may preferably be coated with, for example, silver having a low specific resistance.

The interlayer connection conductor 30 may include a resin in the case where the interlayer connection conductor 30 is formed by the heat treatment of the conductive paste. Examples of the resin to be included in the interlayer connection conductor 30 include a thermosetting resin such as an epoxy resin, a silicone resin, and modified resins thereof, a thermoplastic resin such as an acrylic resin and an urethane resin, and the like. Among these, the interlayer connection conductor 30 preferably includes, for example, a resin including an epoxy resin as a main component. The use of an epoxy resin provides both heat resistance and adhesion at the same time.

In the present specification, the main component denotes a component having the largest content (percentage by weight). The type of the resin included in the interlayer connection conductor 30 can be identified, for example, by using an infrared spectroscopy (IR) analysis, a nuclear magnetic resonance (NMR) analysis, or the like. A sample for performing the above-described analysis can be prepared, for example, by polishing the wiring board 1 such that a cross-section in the same direction as that in FIG. 6 to be described later is visible, and then cutting the interlayer connection conductor 30 out of the cross-section thus obtained.

In the wiring board 1, when a thermal expansion coefficient of the insulating layer 10 in the lamination direction is defined as $\alpha_{z10}$, a thermal expansion coefficient of the interlayer connection conductor 30 in the lamination direction is defined as $\alpha_{z30}$, a storage elastic modulus of the insulating layer 10 is defined as $E'_{10}$, and a storage elastic modulus of the interlayer connection conductor 30 is defined as $E'_{30}$, relationships of $\alpha_{z10} > \alpha_{z30}$ and $E'_{10} > E'_{30}$ are satisfied in a temperature range from, for example, about −40° C. to about 85° C.

Since the relationships of $\alpha_{z10} > \alpha_{z30}$ and $E'_{10} > E'_{30}$ are satisfied in the temperature range from about −40° C. to about 85° C., electric connection between circuits is likely to be maintained easily even when the insulating layer 10 is expanded or contracted due to heating to about 85° C. or cooling to about −40° C. As a consequence, it is possible to reduce or prevent a fluctuation of a resistance value even under an environment in which thermal shocks are repeatedly applied.

Operations and advantageous effects in the case where the relationships of $\alpha_{z10} > \alpha_{z30}$ and $E'_{10} > E'_{30}$ are satisfied are considered as follows.

Figures 1, 2:
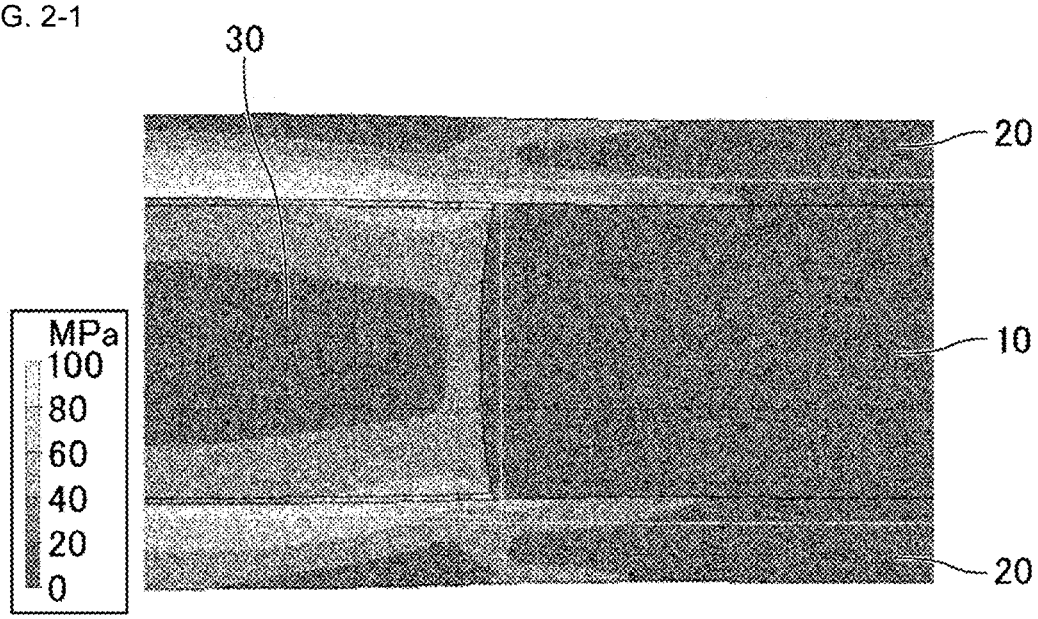
Figure 2:
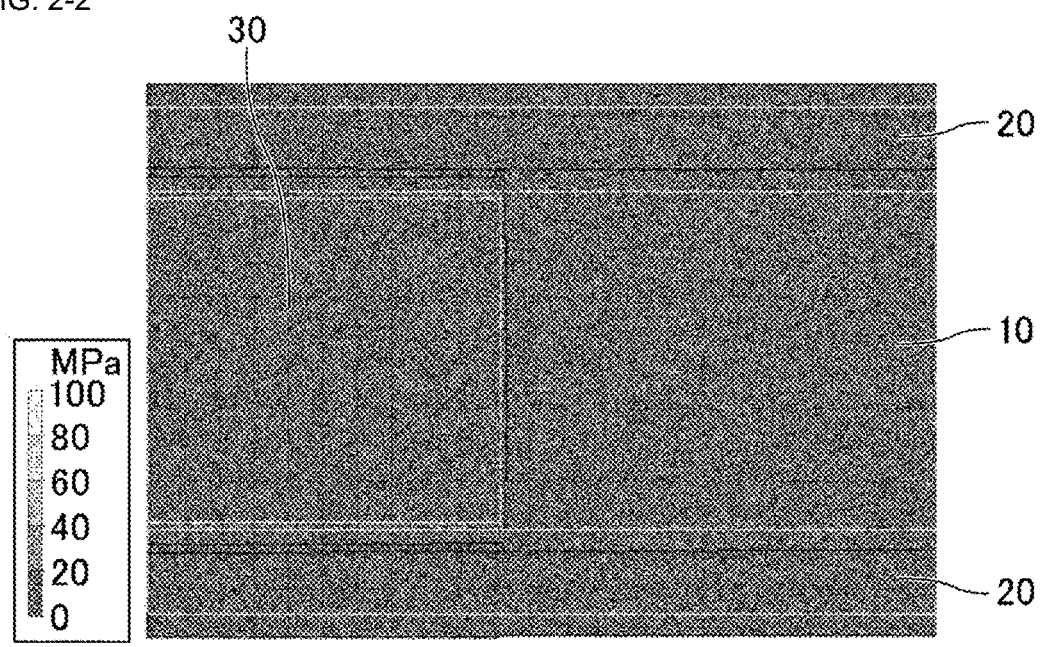

FIG. 2-1 is a stress distribution chart calculated from thermal stress simulation when the temperature is lowered from room temperature to about −40° C. under the conditions of $\alpha_{z10} > \alpha_{z30}$ and $E'_{10} > E'_{30}$. FIG. 2-2 is a stress distribution chart calculated from thermal stress simulation when the temperature is raised from room temperature to about 85° C. under the conditions of $\alpha_{z10} > \alpha_{z30}$ and $E'_{10} > E'_{30}$. Here, FIGS. 2-1 and 2-2 are stress distribution charts in a region indicated by S in FIG. 1, which correspond to Example 2 to be described later.

As illustrated in FIG. 2-1, a relatively large shear stress occurs in particular at an interface between the conductive layer 20 and the interlayer connection conductor 30 because the storage elastic moduli of the insulating layer 10 and the interlayer connection conductor 30 are increased at a low temperature of about −40° C. The lower the storage elastic moduli of the insulating layer 10 and the interlayer connection conductor 30, the more the shear stress is reduced. Since the insulating layer 10 needs to ensure a certain strength, it is possible to reduce or prevent the shear stress that may cause an increase in a resistance value by reducing the storage elastic modulus of the interlayer connection conductor 30, or in other words, by satisfying $E'_{10} > E'_{30}$.

On the other hand, as illustrated in FIG. 2-2, a stress occurring at the interface between the conductive layer 20 and the interlayer connection conductor 30 (a stress in the thickness direction being a direction of delamination in this case) at a high temperature of about 85° C. is very small as compared to that at the time of the low temperature. This stress does not trigger a delamination at the interface between the conductive layer 20 and the interlayer connection conductor 30. Accordingly, it is important to adjust the stress occurring at the interface between the conductive layer 20 and the interlayer connection conductor 30 at the low temperature of about −40° C. rather than that at the high temperature of about 85° C.

Figures 1, 3:
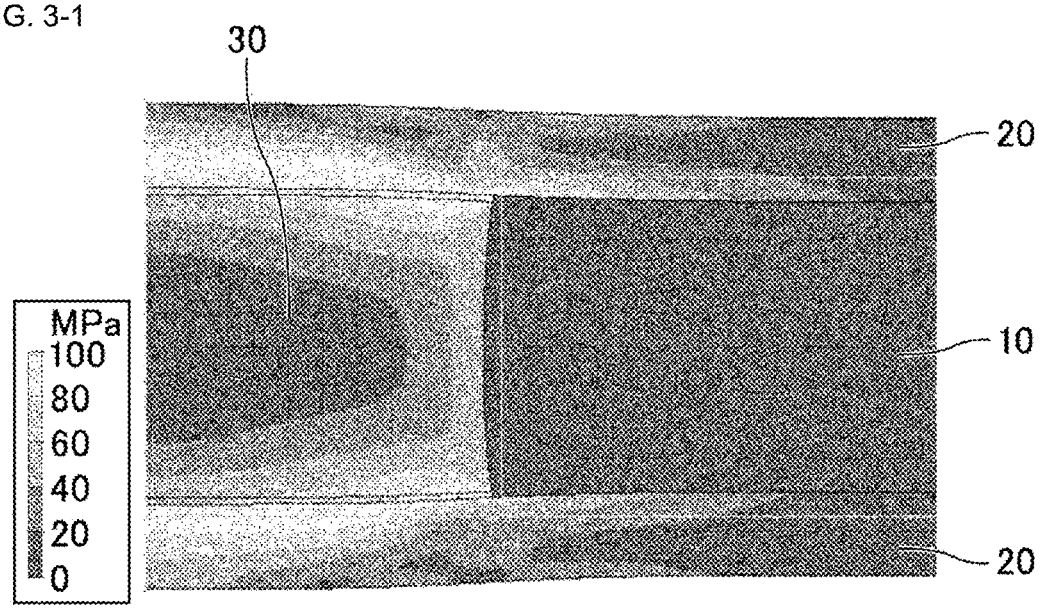
Figures 2, 3:
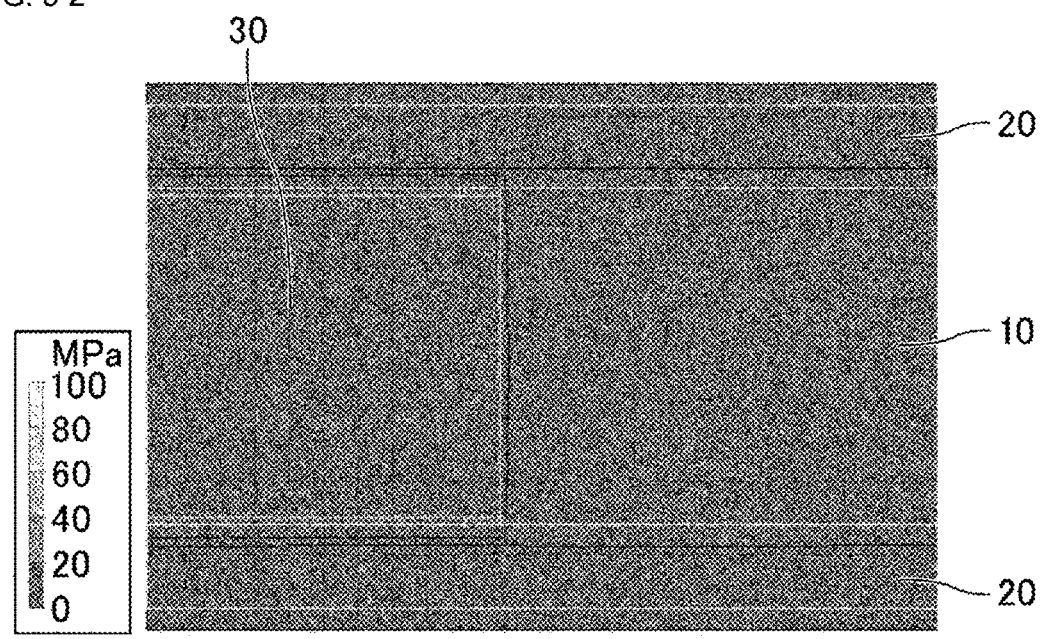

FIG. 3-1 is a stress distribution chart calculated from thermal stress simulation when the temperature is lowered from room temperature to about −40° C. under conditions of $\alpha_{z10} > \alpha_{z30}$ and $E'_{10} < E'_{30}$. FIG. 3-2 is a stress distribution chart calculated from thermal stress simulation when the temperature is raised from room temperature to about 85° C. under the conditions of $\alpha_{z10} > \alpha_{z30}$ and $E'_{10} < E'_{30}$. Here, FIGS. 3-1 and 3-2 are stress distribution charts in the region indicated by S in FIG. 1, which corresponds to Comparative Example 2 to be described later.

It is apparent from FIG. 3-1 that a stress at the interface between the conductive layer 20 and the interlayer connection conductor 30 is higher as compared to the case in FIG. 2-1. On the other hand, it is apparent from FIG. 3-2 that a stress is relaxed as with the case in FIG. 2-2.

As illustrated in FIGS. 2-2 and 3-2, the stress at the interface between the conductive layer 20 and the interlayer connection conductor 30 is reduced at the high temperature of about 85° C. due to the decreases of the storage elastic moduli of the insulating layer 10 and the interlayer connection conductor 30. Accordingly, a delamination is less likely to occur at the interface between the conductive layer 20 and the interlayer connection conductor 30 under the conditions illustrated in FIG. 2-2 as well as the conditions illustrated in FIG. 3-2.

On the other hand, as illustrated in FIGS. 2-1 and 3-1, the stress is concentrated on the interface between the conductive layer 20 and the interlayer connection conductor 30 at the low temperature of about −40° C. due to the increases of the storage elastic moduli of the insulating layer 10 and the interlayer connection conductor 30. However, it is possible to relax the stress to be applied to the interface between the conductive layer 20 and the interlayer connection conductor 30 under the conditions illustrated in FIG. 2-1 because the storage elastic modulus of the interlayer connection conductor 30 is lower than that in the conditions illustrated in FIG. 3-1.

Under the conditions of $\alpha_{z10} < \alpha_{z30}$ and $E'_{10} > E'_{30}$, an amount of contraction of the interlayer connection conductor 30 in the lamination direction is larger than an amount of contraction of the insulating layer 10 in the lamination direction in the process of lowering the temperature from room temperature. Accordingly, a direction of the stress occurring at the interface between the conductive layer 20 and the interlayer connection conductor 30 is, unlike in FIGS. 2-1 and 2-2, the direction of delamination instead of the above-described shearing direction. Moreover, since the storage elastic moduli of the insulating layer 10 and the interlayer connection conductor 30 are high under the low temperature, such increase of the stress causes a marked increase in resistance value.

The thermal expansion coefficient $\alpha_{z10}$ of the insulating layer 10 and the thermal expansion coefficient $\alpha_{z30}$ of the interlayer connection conductor 30 in the lamination direction can be calculated, for example, by preparing each measurement sample by polishing the wiring board 1 such that a cross-section in the same direction as that in FIG. 6 to be described later is visible, then individually cutting the insulating layer 10 or the interlayer connection conductor 30 of the cross-section thus obtained, and then measuring displacements in the lamination direction (the thickness direction, z-axis direction) of the measurement samples by using a high-temperature SEM (scanning electron microscope).

Alternatively, the thermal expansion coefficient $\alpha_{z10}$ of the insulating layer 10 and the thermal expansion coefficient $\alpha_{z30}$ of the interlayer connection conductor 30 in the lamination direction may be obtained by preparing each measurement sample by using the same material as the insulating layer 10 or the interlayer connection conductor 30, and measuring a coefficient of linear expansion in the lamination direction (the thickness direction, the z direction) by using a thermomechanical analysis (TMA) apparatus. Measurement conditions include, for example, a temperature range from about −60° C. to about 250° C., a temperature increase rate of about 5° C./min, a load at about 2 gf (0.02 N), and a measurement of a tensile mode. A thickness of each measurement sample is not limited to a particular thickness but is set to about 200 μm, for example. Although the TMA apparatus is not limited to a particular apparatus, TMA 4000S manufactured by NETZSCH can be used, for example.

The storage elastic modulus $E'_{10}$ of the insulating layer 10 and the storage elastic modulus $E'_{30}$ of the interlayer connection conductor 30 can be measured, for example, by polishing the wiring board 1 such that the cross-section in the same direction as that in FIG. 6 to be described later is visible, and thrusting respective indenters (probes) against the insulating layer 10 or the interlayer connection conductor 30 from the cross-section by using nanoindenters. It is preferable to conduct measurements at several positions of each of the insulating layer 10 and the interlayer connection conductor 30 by using the nanoindenters, and to calculate an average value thereof.

Alternatively, the storage elastic modulus $E'_{10}$ of the insulating layer 10 and the storage elastic modulus $E'30$ of the interlayer connection conductor 30 may be calculated, for example, from a measurement result which is obtained by preparing each measurement sample by using the same material as the insulating layer 10 or the interlayer connection conductor 30, and carrying out a dynamic mechanical analysis test by using a dynamic mechanical analysis (DMA) apparatus. Conditions of the dynamic mechanical analysis test include, for example, a frequency of about 1 Hz, and a temperature increase rate of about 5° C./min. Although the DMA apparatus is not limited to a particular apparatus, DMA 7100 manufactured by Hitachi High-Tech Science Corporation can be used, for example.

The wiring board 1 may be either a rigid board or a flexible board. In the case where the wiring board 1 is a flexible board, the flexible board may include a bent portion. Since the relationships of $\alpha_{z10} > \alpha_{z30}$ and $E'_{10} > E'_{30}$ are satisfied in the temperature range, for example, from about −40° C. to about 85° C., it is possible to reduce or prevent the fluctuation of the resistance value even when the wiring board 1 is the fragile flexible board.

EXAMPLES

Examples for more specifically disclosing the wiring board of example embodiments of the present invention will be discussed below. However, the present invention is not limited to the following examples.

Example 1

Spherical Ag-coated Cu powder (1300Y, manufactured by Mitsui Mining & Smelting Co., LTD.) having an average particle size of about 3 μm, which defines conductive filler, was added to an epoxy resin including about 10 parts by weight of a hard epoxy resin (jER 1009, manufactured by Mitsubishi Chemical Corporation) and about 90 parts by weight of a soft epoxy resin (jER YX7400N, manufactured by Mitsubishi Chemical Corporation). The conductive filler was added by an amount with which its ratio in the conductive paste after curing is equal to about 55% by volume. Moreover, butyl carbitol was added as a solvent, and an imidazole-based latent curing agent (Curezol 2P4MHZ-PW) was also added. Thereafter, these ingredients were mixed by using a three roll mill to prepare the conductive paste. Here, jER 1009 being the hard epoxy resin was blended in advance as a varnish dissolved in butyl carbitol.

Figure 4:
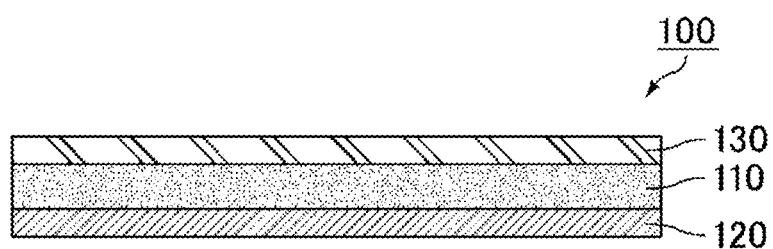
FIG. 4 is a sectional view schematically illustrating a configuration of a copper-clad laminate.

A copper-clad laminate 100 provided with a circuit thereon was prepared as illustrated in FIG. 4. FIG. 4 is a sectional view schematically illustrating a configuration of the copper-clad laminate.

The copper-clad laminate 100 illustrated in FIG. 4 includes three layers of sheets. To be more precise, the copper-clad laminate 100 includes a resin layer 110, metal foil 120 provided on one principal surface of the resin layer 110, and a resin sheet 130 attached to another principal surface of the resin layer 110. In the present example, a liquid crystal polymer (LCP) was used as the resin layer 110, copper foil was used as the metal foil 120, and polyethylene terephthalate (PET) was used as the resin sheet 130.

Figure 5A:
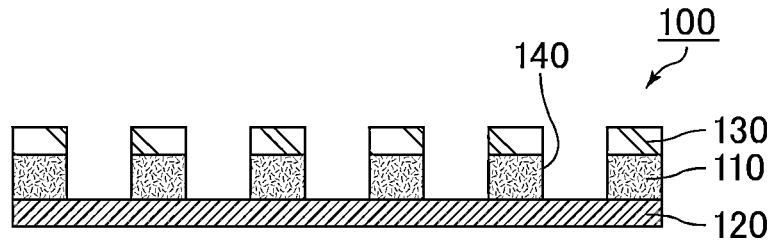
FIGS. 5A to 5C are sectional views schematically illustrating a non-limiting example of a method of filling via holes in the copper-clad laminate with a conductive paste.
Figure 5B:
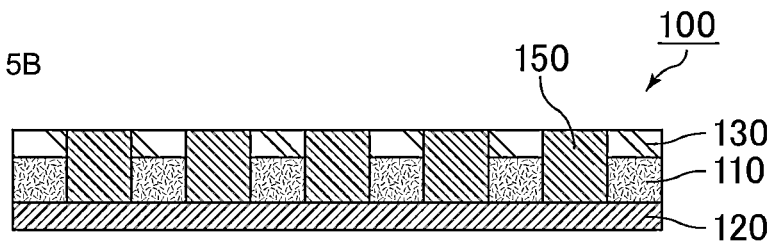
Figure 5C:
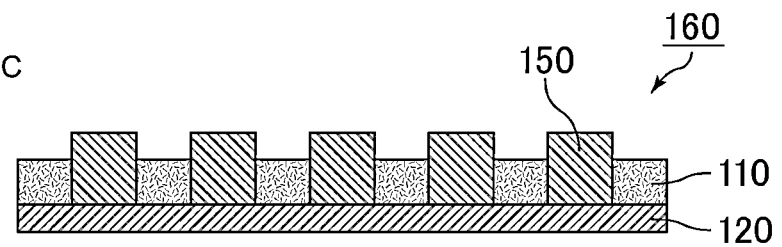

As illustrated in FIGS. 5A to 5C, via holes 140 were formed in the copper-clad laminate 100, and the via holes were filled with a conductive paste 150 prepared in accordance with the above-described example method. FIGS. 5A to 5C are sectional views schematically illustrating a non-limiting example of a method of filling the via holes in the copper-clad laminate with the conductive paste.

The copper-clad laminate 100 illustrated in FIG. 4 was irradiated with a laser from the resin sheet 130 side, thus forming the via holes 140 extending through the resin sheet 130 and the resin layer 110 as illustrated in FIG. 5A. Thereafter, smear generated at the time of forming the holes was removed by performing a desmearing process.

Next, the conductive paste 150 was directly provided into the via holes 140 as illustrated in FIG. 5B by using a squeegee.

Thereafter, the resin sheet 130 attached to one side of the resin layer 110 was peeled off. In this way, a conductive paste-attached sheet 160 in which the conductive paste 150 protrudes from the resin layer 110 was prepared as illustrated in FIG. 5C.

Figure 6:
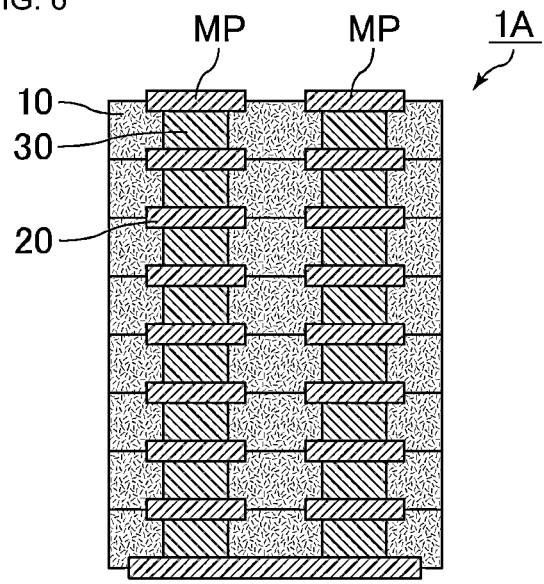
FIG. 6 is a sectional view schematically illustrating a portion of a configuration of a test board.

A test board 1A illustrated in FIG. 6 was prepared by stacking the conductive paste-attached sheets 160 on one another, and performing heating (about 270° C.) and pressurization (about 10 MPa at a maximum) under reduced pressure. FIG. 6 is a sectional view schematically illustrating a portion of a configuration of the test board.

The test board 1A illustrated in FIG. 6 includes insulating layers 10 originating from the resin layers 110, the conductive layers 20 originating from the metal foil 120, and the interlayer connection conductors 30 formed by curing the conductive paste 150.

As will be described later, the conductive layer 20 located on an upper surface of the test board 1A was used as a measurement position MP. FIG. 6 illustrates one measurement position MP. The test board 1A was provided with multiple measurement positions MP. As illustrated in FIG. 6, 16 interlayer connection conductors, 30 in total, are connected to respective measurement positions MP.

Example 2

The test board 1A was prepared in accordance with the same or substantially the same method as the method in Example 1, except that the amount of jER 1009 being the hard epoxy resin was changed to about 20 parts by weight and the amount of jER YX7400N being the soft epoxy resin was changed to about 80 parts by weight. In Example 2, the storage elastic modulus $E'_{30}$ of the interlayer connection conductor 30 being the cured conductive paste is higher than that in Example 1.

Example 3

The test board 1A was prepared in accordance with the same or substantially the same method as the method in Example 1 except that Curezol 2PHZ-PW being a latent curing agent having a higher curing start temperature was used instead of Curezol 2P4MHZ-PW being the imidazole-based latent curing agent.

In Example 3, the curing of the conductive paste does not progress in the process of drying the sheets after filled with the conductive paste, but the curing starts at a stage of pressurization instead. Accordingly, it is possible to increase adhesive power between the conductive layer 20 and the interlayer connection conductor 30 as compared to Example 1.

Example 4

The test board 1A was prepared in accordance with the same or substantially the same method as the method in Example 1 except that an epoxy resin jER 828 that is liquid at room temperature was used instead of the epoxy resin jER 1009 that was formed into the varnish by using the solvent.

Since no solvent is included in the conductive paste in Example 4, an amount of degassing is reduced or prevented in the process of drying the sheet after filled with the conductive paste and in the process of pressurization. As a consequence, it is possible to reduce or prevent a deficiency of reliability attributed to, for example, delaminations, voids, and the like.

Example 5

The test board 1A was prepared in accordance with the same or substantially the same method as the method in Example 1 except that Ag-coated CuNi alloy powder was used as the conductive filler, instead of the spherical Ag-coated Cu powder (1300Y, manufactured by Mitsui Mining & Smelting Co., LTD.).

Electrochemical migration in a finished product is reduced or prevented in Example 5. Accordingly, it is possible to reduce or prevent short-circuit defects.

Comparative Example 1

The test board 1A was prepared in accordance with the same or substantially the same method as the method in Example 1, except that the amount of jER 1009 being the hard epoxy resin was changed to about 100 parts by weight and the amount of jER YX7400N being the soft epoxy resin was changed to about 0 parts by weight. In Comparative Example 1, the storage elastic modulus $E'_{30}$ of the interlayer connection conductor 30 being the cured conductive paste is higher than those in Examples 1 and 2.

Comparative Example 2

The test board 1A was prepared in accordance with the same or substantially the same method as the method in Example 1, except that the amount of jER 1009 being the hard epoxy resin was changed to about 50 parts by weight and the amount of jER YX7400N being the soft epoxy resin was changed to about 50 parts by weight. In Comparative Example 2, the storage elastic modulus $E'_{30}$ of the interlayer connection conductor 30 being the cured conductive paste is higher than those in Examples 1 and 2.

Comparative Example 3

The test board 1A was prepared in accordance with the same or substantially the same method as the method in Example 1, except that the amount of addition of spherical Ag-coated Cu powder (1300Y, manufactured by Mitsui Mining & Smelting Co., LTD.) defining the conductive filler was set so that its ratio in the conductive paste after curing is equal to about 30% by volume. In Comparative Example 3, the mixing ratio of the conductive filler is smaller than that in Example 1. Accordingly, the thermal expansion coefficient $\alpha_{z30}$ of the interlayer connection conductor 30 being the cured conductive paste is higher than that in Example 1.

Heat cycle tests by repeating cooling to about −40° C. (retention time of 30 minutes) and heating to about 85° C. (retention time of about 30 minutes) were performed while using the test boards 1A prepared as described above. Results are shown in Table 1. Table 1 shows the number of times of the heat cycle tests, and ratios of measurement points at which a resistance value after the test reached twice or more of an initial resistance value. Each ratio of the measurement points shown in Table 1 represents a ratio in the case of performing the measurements at a hundred measurement points in total. Here, the resistance value at each measurement point is a value obtained by measuring a resistance value of a circuit connected by using sixteen interlayer connection conductors in total in accordance with the two-terminal method. The value represents a sum of resistances of the interlayer connection conductors (the cured conductive paste), resistances of the conductive layers (the circuit), contact resistances between the interlayer connection conductors and the conductive layers, and contact resistances between the conductive layers and the terminals.

TABLE 1

| NUMBER OF TIMES OF HEAT CYCLE TESTS | RATIO OF MEASUREMENT POINTS AT WHICH RESISTANCE VALUE AFTER TEST REACHED TWICE OR MORE OF INITIAL RESISTANCE VALUE/% | | | | | | | |
|---|---|---|---|---|---|---|---|---|
| | EXAMPLE 1 | EXAMPLE 2 | EXAMPLE 3 | EXAMPLE 4 | EXAMPLE 5 | COMPARATIVE EXAMPLE 1 | COMPARATIVE EXAMPLE 2 | COMPARATIVE EXAMPLE 3 |
| 0 TIMES (INITIAL STATE) | 0.0 | 0.0 | 0.0 | 0.0 | 0.0 | 0.0 | 0.0 | 0.0 |
| 100 TIMES | 0.0 | 1.1 | 0.0 | 0.0 | 0.0 | 52.2 | 32.2 | 15.3 |

TABLE 1-continued

| NUMBER OF TIMES OF HEAT CYCLE TESTS | RATIO OF MEASUREMENT POINTS AT WHICH RESISTANCE VALUE AFTER TEST REACHED TWICE OR MORE OF INITIAL RESISTANCE VALUE/% | | | | | | | |
| --- | --- | --- | --- | --- | --- | --- | --- | --- |
| | EXAMPLE 1 | EXAMPLE 2 | EXAMPLE 3 | EXAMPLE 4 | EXAMPLE 5 | COMPARATIVE EXAMPLE 1 | COMPARATIVE EXAMPLE 2 | COMPARATIVE EXAMPLE 3 |
| 200 TIMES | 0.0 | 1.1 | 0.0 | 0.0 | 0.0 | 63.3 | 33.3 | 20.8 |
| 300 TIMES | 1.1 | 7.8 | 0.7 | 1.5 | 1.1 | 66.7 | 42.2 | 25.4 |

Figure 7:
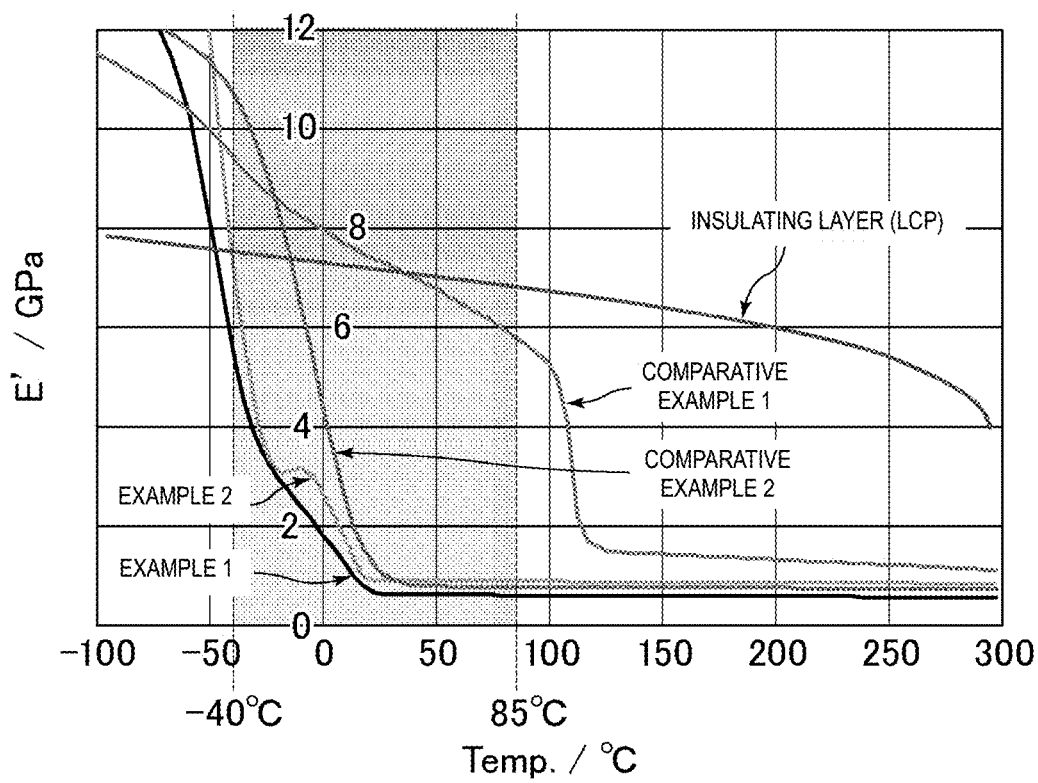
FIG. 7 is a graph illustrating storage elastic moduli E' of interlayer connection conductors in Example 1, Example 2, Comparative Example 1, and Comparative Example 2, and of an insulating layer.

FIG. 7 is a graph illustrating the storage elastic moduli E' of the interlayer connection conductors in Example 1, Example 2, Comparative Example 1, and Comparative Example 2, and of the insulating layer.

As illustrated in FIG. 7, the storage elastic moduli $E'_{30}$ of the interlayer connection conductors 30 (the cured conductive paste) in Examples 1 and 2 were lower than the storage elastic modulus $E'_{10}$ of the insulating layer 10 (LCP) throughout the temperature range from, for example, about −40° C. to about 85° C. being the temperature range of the heat cycle tests. Although not illustrated in FIG. 7, the storage elastic moduli E' 30 of the interlayer connection conductors 30 (the cured conductive paste) in Examples 3 to 5 were also lower than the storage elastic modulus $E'_{10}$ of the insulating layer 10 (LCP) throughout the temperature range from about −40° C. to about 85° C. similarly.

By using the conductive paste having the high ratio of the soft epoxy resin as in Examples 1 to 5, it is possible to maintain a soft state in the temperature range even after the curing. Thus, the electrical connection between the interlayer connection conductor 30 and the conductive layer 20 is retained. As a consequence, it is less likely to cause the fluctuation in resistance values as shown in Table 1.

On the other hand, as illustrated in FIG. 7, the storage elastic moduli $E'_{30}$ of the interlayer connection conductors 30 (the cured conductive paste) in Comparative Examples 1 and 2 were higher than the storage elastic modulus $E'_{10}$ of the insulating layer 10 (LCP) in a temperature range from about −40° C. to a temperature close to room temperature. Accordingly, the interlayer connection conductor 30 cannot plastically follow a deformation of the insulating layer 10. Thus, a large stress is generated at the interface between the interlayer connection conductor 30 and the conductive layer 20 in the temperature range, and a delamination is therefore likely to easily occur. As a consequence, the resistance values are thought to be increased as shown in Table 1.

Figure 8:
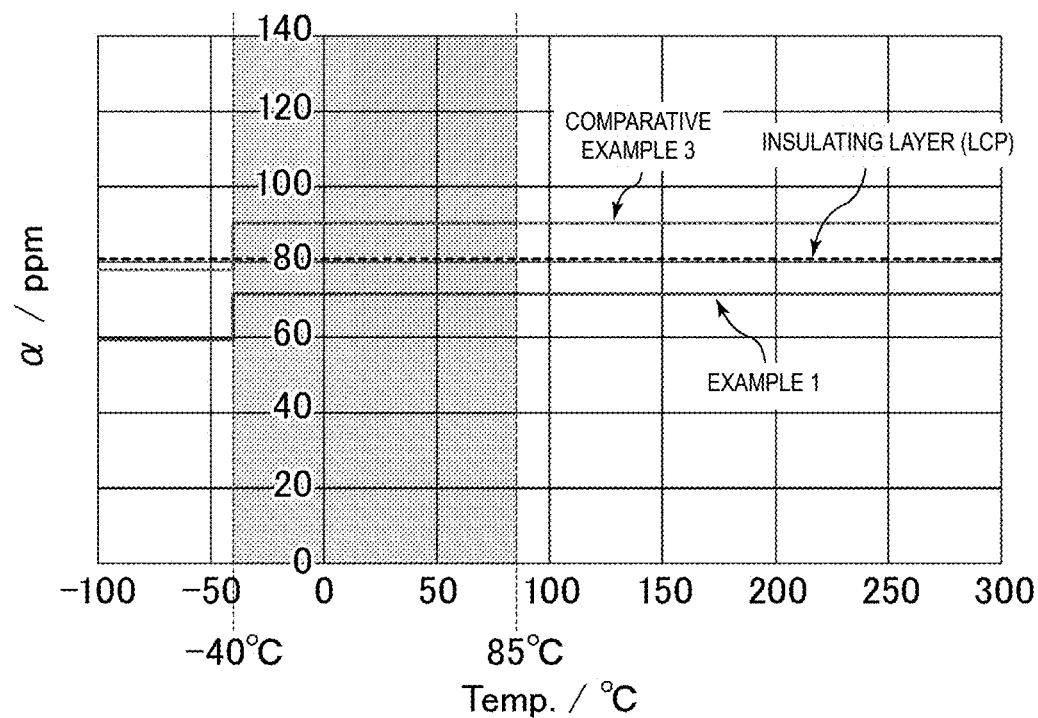
FIG. 8 is a graph illustrating thermal expansion coefficients $\alpha$ in a lamination direction of the interlayer connection conductors in Example 1 and Comparative Example 3, and of the insulating layer.

FIG. 8 is a graph illustrating the thermal expansion coefficients ∝ in the lamination direction of the interlayer connection conductors in Example 1 and Comparative Example 3, and of the insulating layer.

As illustrated in FIG. 8, the thermal expansion coefficient $\alpha_{z30}$ in the lamination direction of the interlayer connection conductor 30 (the cured conductive paste) in Example 1 was lower than the thermal expansion coefficient $\alpha_{z10}$ in the lamination direction of the insulating layer 10 (LCP) throughout the temperature range from about −40° C. to about 85° C. being the temperature range of the heat cycle tests.

On the other hand, the thermal expansion coefficient $\alpha_{z30}$ in the lamination direction of the interlayer connection conductor 30 (the cured conductive paste) in Comparative Example 3 was higher than the thermal expansion coefficient $\alpha_{z10}$ in the lamination direction of the insulating layer 10 (LCP) throughout the temperature range from about −40° C. to about 85° C. In Comparative Example 3, the interlayer connection conductor 30 is likely to contract more easily than the insulating layer 10 does when lowering the temperature from room temperature to about −40° C. Accordingly, a large stress is generated at the interface between the interlayer connection conductor 30 and the conductive layer 20. As a consequence, the resistance value is thought to be increased as shown in Table 1.

A cross-section of the test board in Example 1 was observed with a scanning electron microscope (SEM) as described below.

Figure 9:
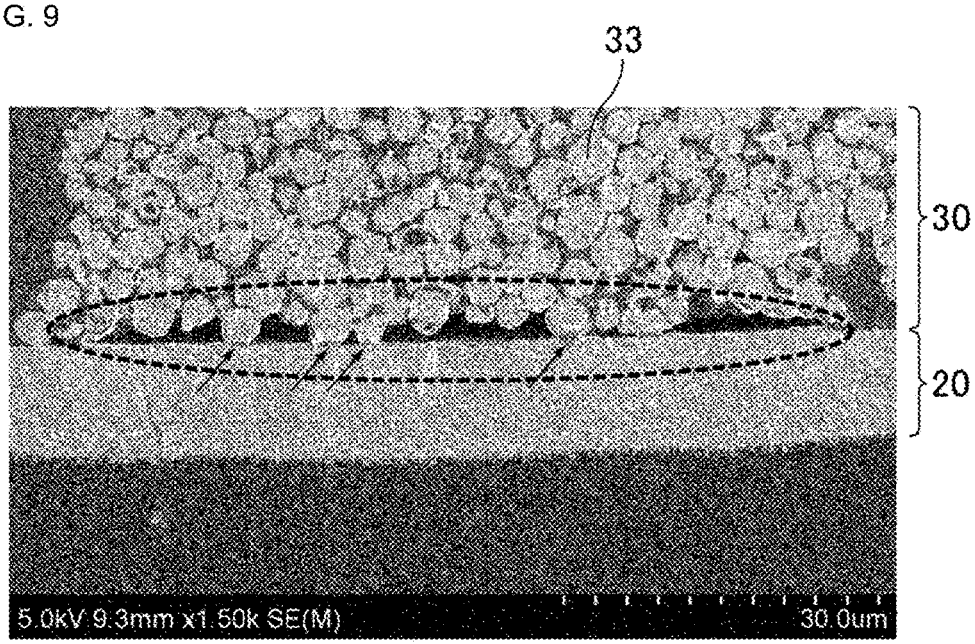
FIG. 9 is an SEM photograph showing a portion in the vicinity of an interface between the interlayer connection conductor and a conductive layer in Example 1.
Figure 10:
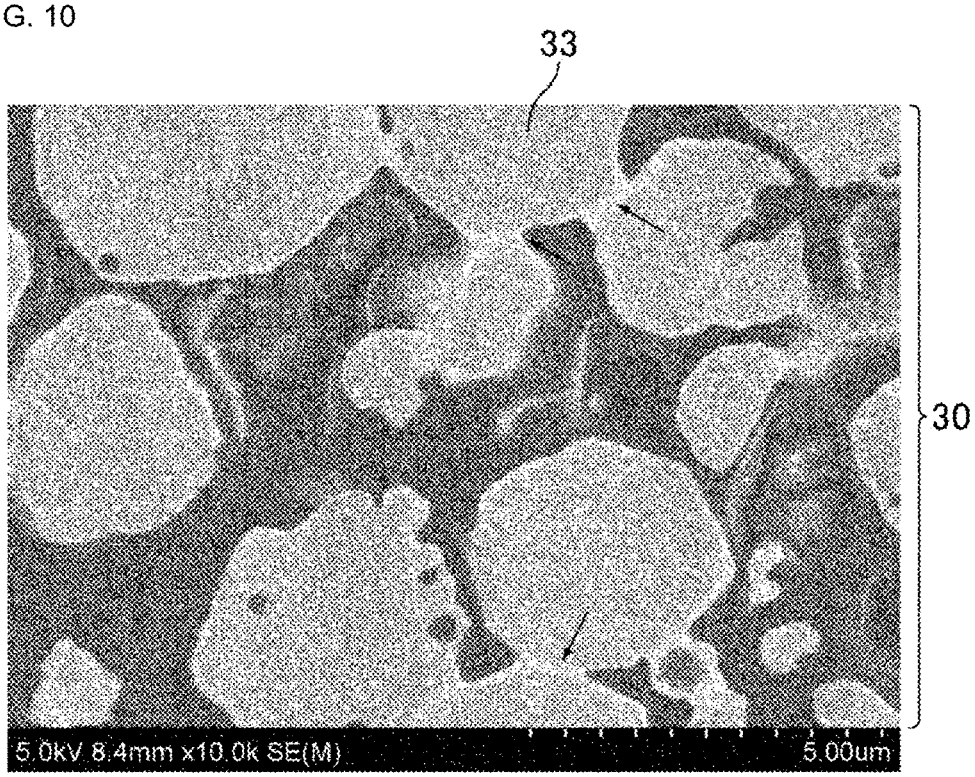
FIG. 10 is an SEM photograph showing conductive filler contained in the interlayer connection conductor in Example 1.

FIG. 9 is an SEM photograph showing a portion in the vicinity of the interface between the interlayer connection conductor and the conductive layer in Example 1. FIG. 10 is an SEM photograph showing the conductive filler contained in the interlayer connection conductor in Example 1.

At the interface between the interlayer connection conductor 30 and the conductive layer 20, which is surrounded by a dashed line in FIG. 9, it is preferable that a portion of conductive filler 33 included in the interlayer connection conductor 30 form metal bonds with the conductive layer 20 as observed at positions indicated with arrows. Alternatively, it is preferable that a portion of the conductive filler 33 included in the interlayer connection conductor 30 form metal bonds with another portion of the conductive filler 33 as observed at positions indicated with arrows in FIG. 10. The metal bonds stabilize the resistance value of the interlayer connection conductor 30.

In the case where a portion of the conductive filler 33 included in the interlayer connection conductor 30 forms the metal bonds with the conductive layer 20 or in the case where a portion of the conductive filler 33 included in the interlayer connection conductor 30 form the metal bonds with another portion of the conductive filler 33, the conductive filler 33 is, for example, preferably made from powder of copper or powder of a copper alloy with a surface being at least partially coated with a metal, or more preferably made from powder of copper or powder of a copper alloy with a surface being at least partially coated with silver. In the curing process of the conductive paste, heating and pressure bonding processes are performed at, for example, about 270° C. at a maximum and at about 10 MPa. Accordingly, when a surface of the conductive filler 33 is coated with the metal, metal bonding is assumed to accelerate.

Figure 11:
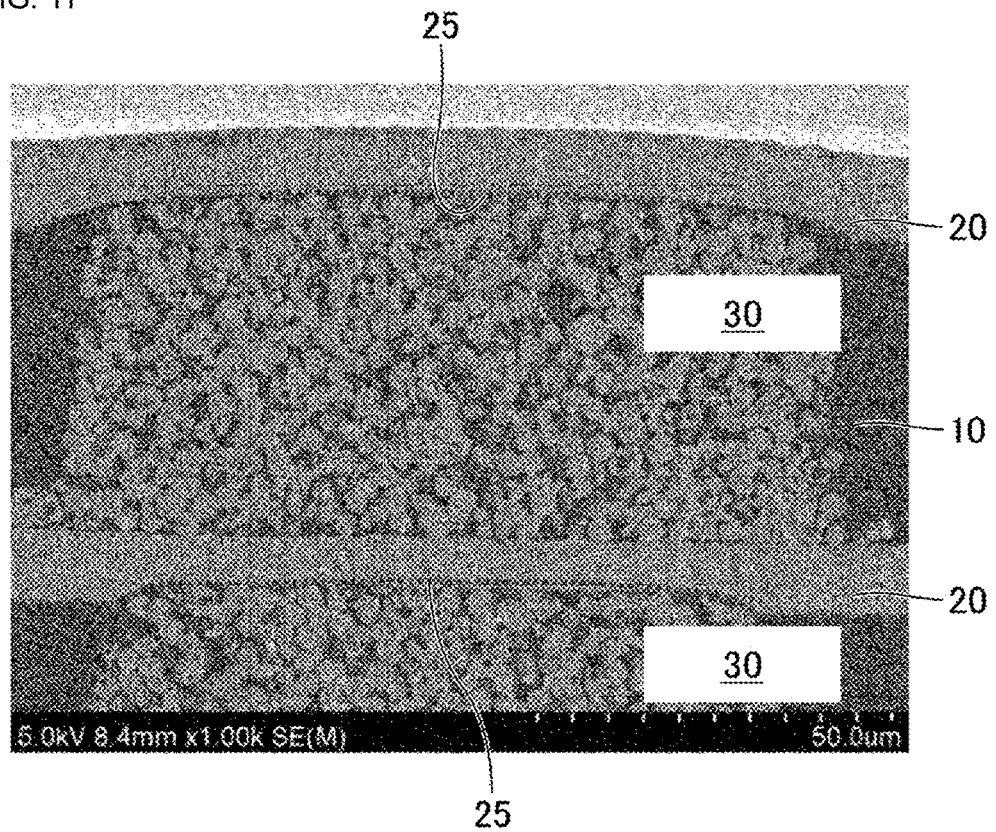
FIG. 11 is an SEM photograph showing a shape of the interlayer connection conductor in Example 1.

FIG. 11 is an SEM photograph showing a shape of the interlayer connection conductor in Example 1.

As shown in FIG. 11, the interlayer connection conductor 30 is preferably positioned at a dent 25 of the conductive layer 20 at the interface between the interlayer connection conductor 30 and the conductive layer 20. In this case, it is possible to reduce or prevent the delamination of the interlayer connection conductor 30 due to the shear stress at the low temperature. For example, the dent 25 of the conductive layer 20 can be formed by etching or the like.

In the case where the dent 25 of the conductive layer 20 is formed by etching or the like, it is preferable that at least a portion of the interface between the interlayer connection conductor 30 and the conductive layer 20 is not provided with an anti-rust layer. The electric connection between the interlayer connection conductor 30 and the conductive layer 20 is increased at a position not provided with the anti-rust layer. In this case, the anti-rust layer may be excluded from the entire or substantially the entire interface between the interlayer connection conductor 30 and the conductive layer 20, or the anti-rust layer may be excluded from a portion of the interface between the interlayer connection conductor 30 and the conductive layer 20.

On the other hand, an anti-rust layer may be provided at an interface between the insulating layer 10 and the conductive layer 20, or may be excluded from the interface between the insulating layer 10 and the conductive layer 20.

For example, the anti-rust layer may be either a layer including one or more elements selected from the group consisting of nickel, zinc, tin, cobalt, molybdenum, copper, tungsten, phosphorus, arsenic, chromium, vanadium, titanium, aluminum, gold, silver, platinum group elements, iron, and tantalum, or any of a metal layer and an alloy layer including one or more elements selected from the group consisting of nickel, zinc, tin, cobalt, molybdenum, copper, tungsten, phosphorus, arsenic, chromium, vanadium, titanium, aluminum, gold, silver, platinum group elements, iron, and tantalum. The anti-rust layer may include, for example, any of an oxide, a nitride, and a silicide including one or more elements selected from the group consisting of nickel, zinc, tin, cobalt, molybdenum, copper, tungsten, phosphorus, arsenic, chromium, vanadium, titanium, aluminum, gold, silver, platinum group elements, iron, and tantalum.

A surface roughness of a portion of the conductive layer 20 in contact with the insulating layer 10 is preferably larger than a surface roughness of a portion of the conductive layer 20 in contact with the interlayer connection conductor 30. In this way, adhesion between the insulating layer 10 and the conductive layer 20 is improved.

Figure 12:
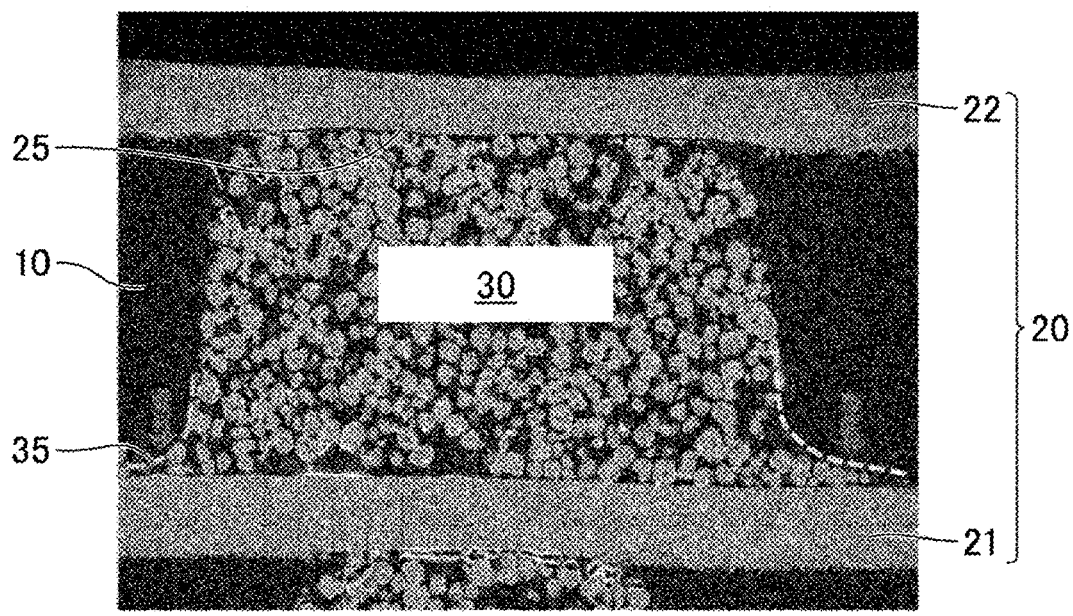
FIG. 12 is an SEM photograph showing a shape of another interlayer connection conductor in Example 1.

FIG. 12 is an SEM photograph showing a shape of another interlayer connection conductor in Example 1.

As illustrated in FIG. 12, in a case where the conductive layer 20 includes the first conductive layer 21 and the second conductive layer 22, the interlayer connection conductor 30 preferably includes an inclined surface 35 provided at an end portion on the first conductive layer 21 side. The inclined surface 35 has a conductor width that increases toward the first conductive layer 21, and the end portion on the first conductive layer 21 side of the interlayer connection conductor 30 is preferably located between the first conductive layer 21 and the insulating layer 10. By providing the end portion of the interlayer connection conductor 30 including an increasing base portion and this portion is located between the first conductive layer 21 and the insulating layer 10. In this way, the interlayer connection conductor 30 can be firmly connected to the conductive layer 20.

As with FIG. 11, the interlayer connection conductor 30 is preferably positioned at a dent 25 of the second conductive layer 22 at an interface between the interlayer connection conductor 30 and the second conductive layer 22.

It is preferable that the anti-rust layer is excluded from at least a portion of the interface between the interlayer connection conductor 30 and the second conductive layer 22. In this case, the anti-rust layer may be excluded from the entire or substantially the entire interface between the interlayer connection conductor 30 and the second conductive layer 22, or the anti-rust layer may be excluded from a portion of the interface between the interlayer connection conductor 30 and the second conductive layer 22. On the other hand, an anti-rust layer may be provided at an interface between the insulating layer 10 and the second conductive layer 22, or may be excluded from the interface between the insulating layer 10 and the second conductive layer 22.

A surface roughness of a portion of the second conductive layer 22 in contact with the insulating layer 10 is preferably larger than a surface roughness of a portion of the second conductive layer 22 in contact with the interlayer connection conductor 30.

The wiring board of the present invention is not limited to the above-described example embodiments. Various applications and modifications can be included within the range of the present invention in view of the configuration of the wiring board, manufacturing conditions thereof, and so forth.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wiring board comprising:
   an insulating layer;
   a conductive layer on the insulating layer; and
   an interlayer connection conductor extending through the insulating layer in a lamination direction in which the insulating layer and the conductive layer are laminated, the interlayer connection conductor being connected to the conductive layer; wherein
   when a thermal expansion coefficient of the insulating layer in the lamination direction is defined as $\alpha_{Z10}$, a thermal expansion coefficient of the interlayer connection conductor in the lamination direction is defined as $\alpha_{Z30}$, a storage elastic modulus of the insulating layer is defined as $E'_{10}$, and a storage elastic modulus of the interlayer connection conductor is defined as $E'_{30}$, relationships of $\alpha_{Z10} > \alpha_{Z30}$ and $E'_{10} > E'_{30}$ are satisfied in a temperature range from about −40° C. to about 85° C.

2. The wiring board according to claim 1, wherein a portion of conductive filler included in the interlayer connection conductor provides a metal bond with the conductive layer, or portions of the conductive filler included in the interlayer connection conductor provide a metal bond with each other.

3. The wiring board according to claim 1, wherein the conductive filler includes a powder of copper or a powder of a copper alloy with a surface being at least partially coated with a metal.

4. The wiring board according to claim 2, wherein the conductive filler includes a powder of copper or a powder of a copper alloy with a surface being at least partially coated with silver.

5. The wiring board according to claim 1, wherein the interlayer connection conductor is positioned at a dent of the conductive layer at an interface between the interlayer connection conductor and the conductive layer.

6. The wiring board according to claim 1, wherein
   the conductive layer includes:
      a first conductive layer on one principal surface of the insulating layer; and
      a second conductive layer on another principal surface of the insulating layer;

the interlayer connection conductor includes an inclined surface at an end portion on a first conductive layer side, the inclined surface having a conductor width that increases toward the first conductive layer; and the end portion of the interlayer connection conductor on the first conductive layer side is located between the first conductive layer and the insulating layer.

7. The wiring board according to claim 6, wherein the interlayer connection conductor is positioned at a dent of the second conductive layer at an interface between the interlayer connection conductor and the second conductive layer.

8. The wiring board according to claim 1, wherein at least a portion of an interface between the interlayer connection conductor and the conductive layer is not provided with an anti-rust layer.

9. The wiring board according to claim 1, wherein the insulating layer includes a liquid crystal polymer.

10. The wiring board according to claim 1, wherein the wiring board is a flexible board including a bent portion.

11. The wiring board according to claim 1, wherein the interlayer connection conductor includes a resin including epoxy resin as a main component.

12. The wiring board according to claim 1, wherein a thickness of the insulating layer is about 10 μm or more and about 200 μm or less.

13. The wiring board according to claim 1, wherein a thickness of the insulating layer is about 20 μm or more and about 100 μm or less.

14. The wiring board according to claim 1, wherein the conductive layer includes at least one of copper, silver, aluminum, stainless steel, nickel, or gold, or an alloy including at least one of copper, silver, aluminum, stainless steel, nickel, or gold.

15. The wiring board according to claim 1, wherein the conductive layer is made of a copper foil.

16. The wiring board according to claim 1, wherein the conductive layer includes a matte surface of one principal surface side and a shiny surface of another principal surface side.

17. The wiring board according to claim 1, wherein a thickness of the conductive layer is about 1 μm or more and about 35 μm or less.

18. The wiring board according to claim 1, wherein a thickness of the conductive layer is about 6 μm or more and about 18 μm or less.

* * * * *